(12) United States Patent
Lee

(10) Patent No.: US 6,516,067 B1
(45) Date of Patent: Feb. 4, 2003

(54) ANTI POP FOR POWER OFF

(75) Inventor: Kok Fah Lee, Singapore (SG)

(73) Assignee: Thomson Licensing, S.A., Boulogne-Billancourt (FR)

( * ) Notice: Subject to any disclaimer, the term of this patent is extended or adjusted under 35 U.S.C. 154(b) by 0 days.

(21) Appl. No.: 09/028,394

(22) Filed: Feb. 24, 1998

(30) Foreign Application Priority Data

Feb. 26, 1997 (GB) ............................................. 9703938

(51) Int. Cl.⁷ ................................................ H04B 15/00
(52) U.S. Cl. ...................... 381/94.5; 941/94.6; 941/94.8
(58) Field of Search ........................... 381/93, 83, 120, 381/121, 94, 94.5, 94.1, 94.6, 94.8; 455/222

(56) References Cited

U.S. PATENT DOCUMENTS

| | | | | |
|---|---|---|---|---|
| 4,246,634 A | * | 1/1981 | Purol | 363/49 |
| 4,500,833 A | * | 2/1985 | Napp et al. | 323/359 |
| 5,124,906 A | * | 6/1992 | Kang | 363/21 |
| 5,151,942 A | * | 9/1992 | Sasaki | 381/94 |
| 5,255,094 A | * | 10/1993 | Yong et al. | 348/632 |
| 5,300,892 A | * | 4/1994 | Hirai | 330/51 |
| 5,307,025 A | * | 4/1994 | Colvin et al. | 330/267 |
| 5,420,535 A | * | 5/1995 | Nebuloni et al. | 381/120 |
| 5,488,258 A | * | 1/1996 | Honda | 330/149 |
| 5,570,427 A | * | 10/1996 | Nishioka | 318/94 |
| 5,703,528 A | * | 12/1997 | Nebuloni et al. | 381/94 |
| 5,818,299 A | * | 10/1998 | Tran | 381/94 |
| 5,825,251 A | * | 10/1998 | Nakagawa | 381/94.5 |

FOREIGN PATENT DOCUMENTS

| | | | | |
|---|---|---|---|---|
| EP | 0562414 | 3/1998 | ............. | H03F/1/30 |
| GB | 2280803 | 2/1995 | ............. | H03G/3/34 |
| GB | 2251350 | 5/1995 | ............. | H03F/1/00 |

* cited by examiner

Primary Examiner—Forester W. Isen
Assistant Examiner—Laura A. Grier
(74) Attorney, Agent, or Firm—Joseph S. Tripoli; Robert D. Shedd (57) ABSTRACT

In order to quickly decrease voltage applied to a mute pin 18 of an audio amplifier circuit 19 of an electronic appliance, an end of a capacitor 20 connected to the mute pin is connected to a discharge circuit which is fired on when the electronic appliance is switched from on to off or stand-by by exploiting two power supply sources of the appliance. The voltage output of one of them decreases faster than the other one when the electronic appliance is switched off. An active element 27 of the discharge circuit has an electrode coupled to the first source and an other electrode coupled to the second sources so that the active element is fired on as soon as the difference between the two output voltages reaches a threshold.

7 Claims, 6 Drawing Sheets

ANTI POP FOR POWER OFF

FIELD OF THE INVENTION

The invention pertains to the field of anti-pop circuitry for electronic appliances including at least one loudspeaker.

BACKGROUND OF THE INVENTION

It is known in such appliances that during some operations of the appliance an undesired sound, known as a pop or click sound, may be heard, coming from the loudspeaker. Five operations can trigger said pop sound. They are "power on" of the circuit, or going from "on" or "off" to "standby", or for instance in a television set "changing channel", or "muting the sound", or "switching off" the apparatus. Such a pop sound is caused in each of those five cases by a spurious signal which is created and introduced, when said operation are performed, at the input or output of an amplifier driving the loudspeaker. In each of said operation a power supply of the loudspeaker amplifier applies to said amplifier voltages that are changing quickly causing transient currents to flow in circuitry in an uncontrolled manner. In addition to possible damages to the loudspeaker such a pop sound is not agreeable to hear. It is the reason why, circuitry have been already designed in order to prevent any spurious signal reaching the amplifier input or output while any one of said five operations is performed. The purpose of said circuit is to control the level of a biasing signal of the amplifier and/or the level of the output, in such a way that such levels are set on or off with a steady and slow enough variation that will cause no rapid movement, of a membrane of the loudspeaker, to create an audible sound.

Examples of such attempts to reduce transient voltages at an output of an audio amplifier is shown in UK patent application n° GB 2 096 423 (D1). EP patent application n° EP 0562 414 A1 (D2) in the name of the applicant also shows a circuit to prevent pop sound coming from an intermediate frequency amplifier. Generally the steady and slow enough variation of the biasing or output voltage is got through an RC integrating network. The time constant of said network is great enough to prevent pop sound to occur. Such a solution is good but does not always prevent a transient arising. For instance, in D1 a prior art solution is described and discussed in relation with FIGS. 1 and 2. It is explained that due to necessary differences in time constant of RC networks connected one to the inverting input, and the other to the non inverting input of an operational amplifier of sound, a sharp transient is appearing while the amplifier is turn on. Said voltage transient is reproduced as undesired sounds by a loudspeaker connected to the amplifier (page 2 column 1 lines 42–45). To cope with this situation, it is proposed in D1 to add a control transistor 16 (see FIG. 3 of D1). Said control transistor ensures that voltage at the output of a push-pull amplifier is increasing as the charge of a capacitor. Said kind of gate transistor does not always prevent any pop from being heard. For instance in D2 it is explained that in spite of such a control transistor, a pop was still heard. To avoid said pop an anti-pop circuit has been provided at the level of an intermediate frequency amplifier. It is always difficult when conceiving a circuit to forecast all the transient currents that may appear and have an effect at the level of the sound amplifier. The present invention concerns an improvement of a circuit in which a pop sound was still heard when the apparatus was switched from on to off. As in most recent appliances, in preferred embodiments, the main functions of the apparatus are under control of a microprocessor. The micro-processor needs some time to actually detect the existing of a power interruption and to provide respective power interrupt subroutines to the different circuitry of the set. This point will be commented and explained here below.

The different voltages which are necessary for instance in a television set are produced, out of a main supply source by means of two different circuits. A first power supply circuit known in the art as switched mode power supply (SMPS) delivers two important outputs known as UB and UA supplies. UB supply is generally of 180 volts and is used for the horizontal deflection system of the cathode ray tube. UA supply is generally of about 22 volts and is used among others for the audio amplifier, for some integrated circuits processing video signal, and for producing a 5 volts supply for the microprocessor. More information about such power supply of television receivers is available for instance in two articles of VAN SCHAIK headed "An introduction to switched mode power supplies in television receivers" and "Control circuits for SMPS in TV receivers" published pages 93 to 108 in n° 3 of vol. 34 September 1976 and pages 162 to 180 of n° 4 of said volume of December 1976 of the review "Electronic applications bulletin" from PHILLIPS'. Said articles have also been published in n° 135 and 136 of the British review "Mullard technical communications" respectively of July and October 1977. The main reason of using the supply of the switched mode power supply to feed the microprocessor is because it is a supply which is available during stand-by time of the apparatus. The microprocessor is then still fed in order to be ready to execute orders coming for instance from a remote control of the apparatus. The second power supply is taken out of a fly-back transformer whose primary side receives a return pulse produced by an horizontal deflection coil of the cathode ray tube each time an electron beam of the tube is driven from an end of a line of the screen of the tube, to the beginning of next line. Due to this fact, voltage produced out of this second power supply is available only when the electrons beam of the tube is in scanning mode. The characteristics of all auxiliary power outputs produced out of the fly-back power supply compared to the supply produced out of the switched mode power supply are shorter discharging time and sharper roll off waveform. Said in an other way the switched mode power supply takes longer time to shut down its operation as compared to the fly-back supply. This results from the large capacitors of the switched mode power supply which are necessary to store energy to cope with sudden changes in the instant consumption and to provide the starting energy to start the apparatus when passing from stand-by to on.

Figure 1:
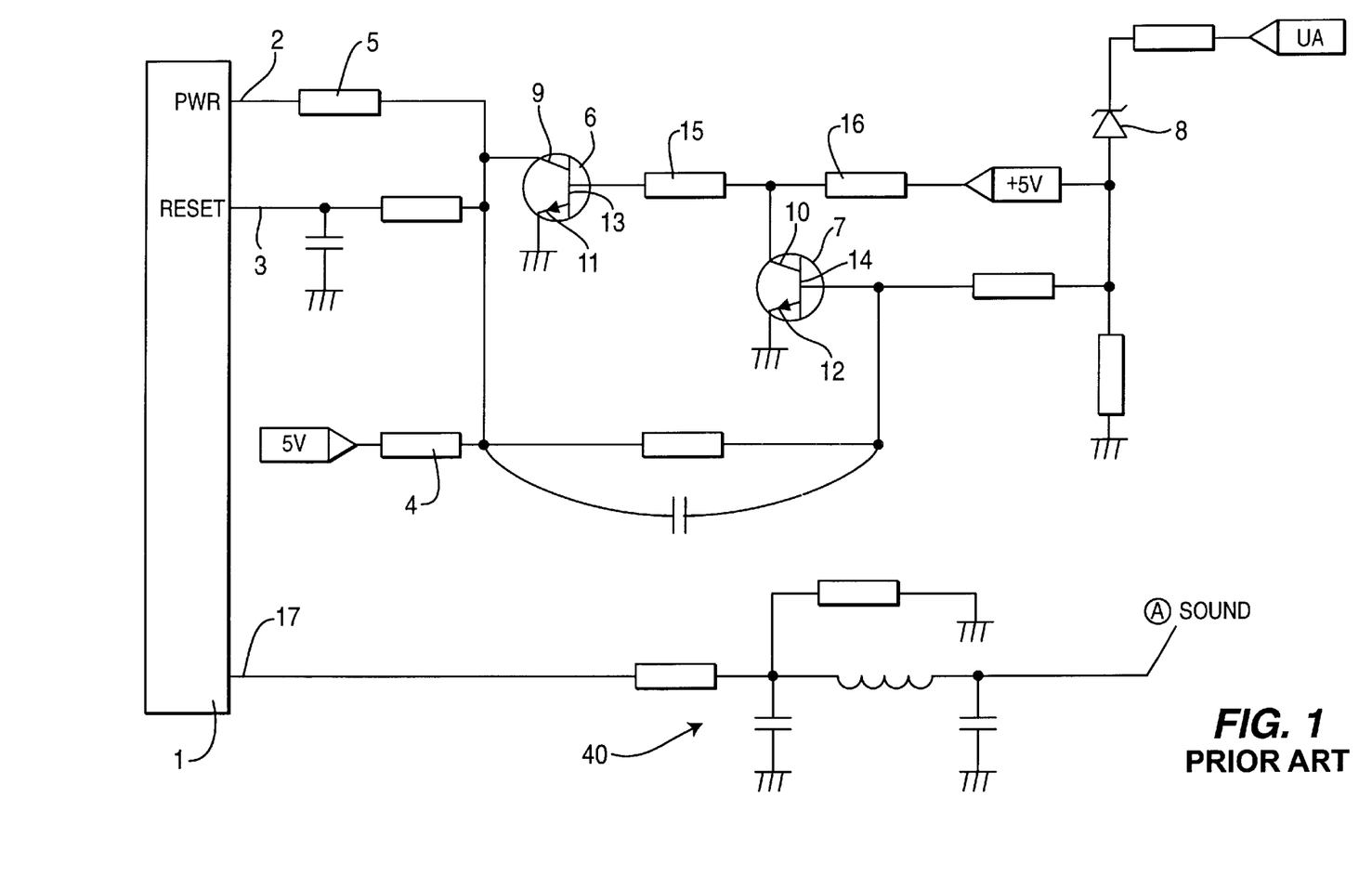
FIG. 1 already discussed is a known electrical diagram showing how a power interrupt signal is converted into a mute order for an audio amplifier circuit.

An example of a known control circuit to mute the loudspeakers of an apparatus is shown in figures one and two attached to the present application. The control circuit is based on a microprocessor 1. In FIG. 1 only the features, and in particular inputs and outputs of microprocessor 1, useful for the understanding of the generation of the pop sound have been represented. Microprocessor 1 has an input 2 to detect a power interruption signal, and a reset input 3. The input 2 receives a 5 volts voltage through resistors 4 and 5. Input 2 is also connected to an interrupt circuit that will pull down voltage at input 2 when the power supply is switched off. The microprocessor detects the change of level at pin 2 and then starts interrupt sub-routines to switch off various circuit of the apparatus. The interrupt circuit comprises substantially two transistors, a first 6, a second 7, and a zener diode 8. The first and second transistors 6, 7 have each a collector 9, 10 respectively, an emitter 11, 12 respectively and a base 13, 14 respectively.

In normal operation 5 volts is supplied to pin 2 through resistors 4 and 5, as explained above. The collector 9 of first transistor 6 which is coupled to pin 2 receives also 5 volts. The base 13 of first transistor 6 is at about the same potential as the emitter 11 of said first transistor 6. Said emitter 11 is connected to earth and said base 13 is short-circuited to earth through second transistor 7 collector 10 emitter 12 path which is conducting. It results from this fact that the base emitter voltage of transistor 6 is not sufficient to make conductive the collector emitter path of transistor 6 and transistor 6 is blocked, and pin 2 is at 5 volts level. When the television set is switched off, the UA supply decreases. The voltage at the base 14 of transistor 7, which is coupled to UA voltage through zener diode 8 is dropped to almost 0 as soon as the zener diode 8 is blocked due to the decreasing of voltage UA. Transistor 7 is then blocked and no longer short-circuits base 13 of transistor 6 to earth. The voltage at the base 13 of transistor 6 which is connected to 5 volts source through resistors 15, 16 increases to a sufficient level to make conductive transistor 6. The result is that the potential of pin 2 is dropped to 0 through the collector emitter path of transistor 6. This drop of voltage is a signal for the microprocessor to start the interrupt routines, in particular an interrupt routine to mute the audio amplifier through a command circuit 40 starting from an output 17 of the microprocessor 1.

As may be understood from the process that has just been described, the detection of the power interrupt after switching off the TV set and activation of the mute command takes time. While said time is elapsing it is supposed that transient currents have already reached the level of the audio amplifier and provoked an audible pop sound.

Figure 2:
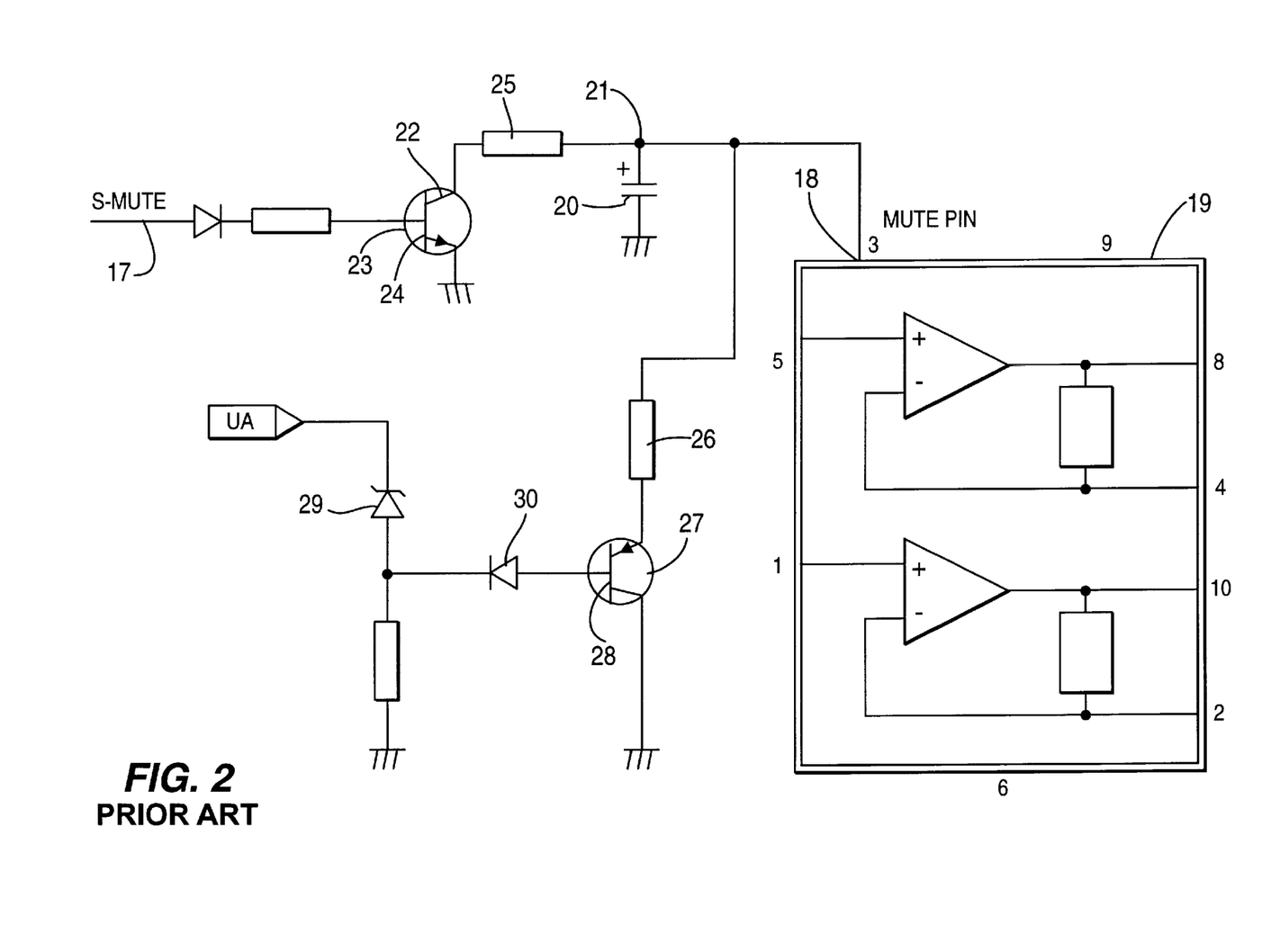
FIG. 2 already discussed is a known electrical diagram showing how a mute terminal of an audio amplifier circuit is pulled down when a power interrupt is present

FIG. 2 shows how the mute signal coming from output 17 of microprocessor 1 is used to drop down a voltage at mute pin 18 of an integrated audio power amplifier circuit 19. As long as a capacitor 20 having one end 21 connected to pin 18 is charged, muting is not active. End 21 of capacitor 20 is also connected to the collector 22 of a transistor 23 the base 24 of which receives the mute signal coming from mute order pin 17 of microprocessor 1. When mute signal is present, transistor 23 is conductive and capacitor 20 discharges through collector emitter path of transistor 23 and through a resistor 25. Pin 18 of integrated circuit 19 is also connected to a second discharging circuit comprising a resistor 26 and a transistor 27 in series. Base 28 of transistor 27 is coupled to UA voltage through a zener diode 29 and a diode 30 connected together in series. As long as UA is high, transistor 27 is blocked. When UA decreases because the set has been set off, transistor 27 becomes conductive, and capacitor 20 discharges through resistor 26 and emitter collector path of transistor 27, pulling down the voltage of mute pin 18 of amplifier circuit 19. To sum up in this known device each time there is a power interruption, mute pin 18 is pull down by discharging capacitor 20 through two parallel circuits, a first one, through transistor 23 controlled by a mute order coming from the microprocessor and a second one, through transistor 27 which is dependent only of the level of UA voltage. In spite of those two parallel circuits the muting is not fast enough to prevent transient currents from triggering a pop sound.

SUMMARY OF THE INVENTION

The anti-pop sound circuitry according to the invention is a fast muting circuitry that can be used with any kind of audio power amplifier included in an electronic appliance, in particular a set comprising a cathode ray tube, a power supply for the sweeping of said tube, and a muting or volume control facility. The circuit according to the invention does not cause in normal operation, any side effect to the audio power amplifier because it is not able to modify voltage present at the level of a mute or volume pin of the audio amplifier. The circuit of the invention becomes operative only when the power off has been activated. When power off has been activated, the circuit according to the invention helps in pulling down voltage present at the volume or muting control pin of the audio amplifier in a fast enough manner to prevent any transient currents that are created when off is pressed, being transformed into an amplified transient that will steer the amplifier and create an undesired pop sound.

To sum up the invention concerns an electronic appliance including a power supply fitted with two transformers, a switched mode transformer and a fly-back transformer, said appliance including also an audio amplifier and said amplifier having a mute pin, the voltage of which is dependent upon the charge of a capacitor having one end coupled to said mute pin, said capacitor being also connected to a constant voltage terminal through a first transistor, said first transistor having three electrodes, a collector an emitter and a control or base electrode and said capacitor being connected to said constant voltage terminal through the collector emitter path of said first transistor, the improvement comprising the base of said first transistor being connected to an electrode of a second transistor, said second transistor having three electrodes a collector an emitter and a base, said collector emitter path of said second transistor being coupled to a voltage source produced out of the switched mode power transformer and wherein the base of said second transistor is coupled to a voltage source produced out of the fly-back transformer, so that when switching off the electronic appliance, the second transistor becomes conductive and trigger the first transistor that becomes also conductive, causing the collector emitter path of said first transistor to discharge said capacitor and mute the audio amplifier.

It is to be noted that arrangement of power supply with a switched mode transformer and a fly-back transformer is usually found in apparatus including a cathode ray tube. In such apparatus the fly-back transformer uses pulses in synchronism with a return pulse of the electron beam of the tube, which pulses are related to horizontal deflection coil of the tube. Said synchronism avoid parasitic effects on the screen of the tube. However the invention could also be used whenever two types of power supply are provided in one apparatus, a first and a second and when voltage produced by the first supply is decreasing faster than voltage produced by the second one.

BRIEF DESCRIPTION OF THE DRAWINGS

A preferred embodiment of the invention will now be described, by way of example only, with reference to the appended drawings in which:

FIG. 7 is representing the audio level for an apparatus without the invention and FIG. 8 for an apparatus with the invention.

DESCRIPTION OF A PREFERRED EMBODIMENT

Figure 3:
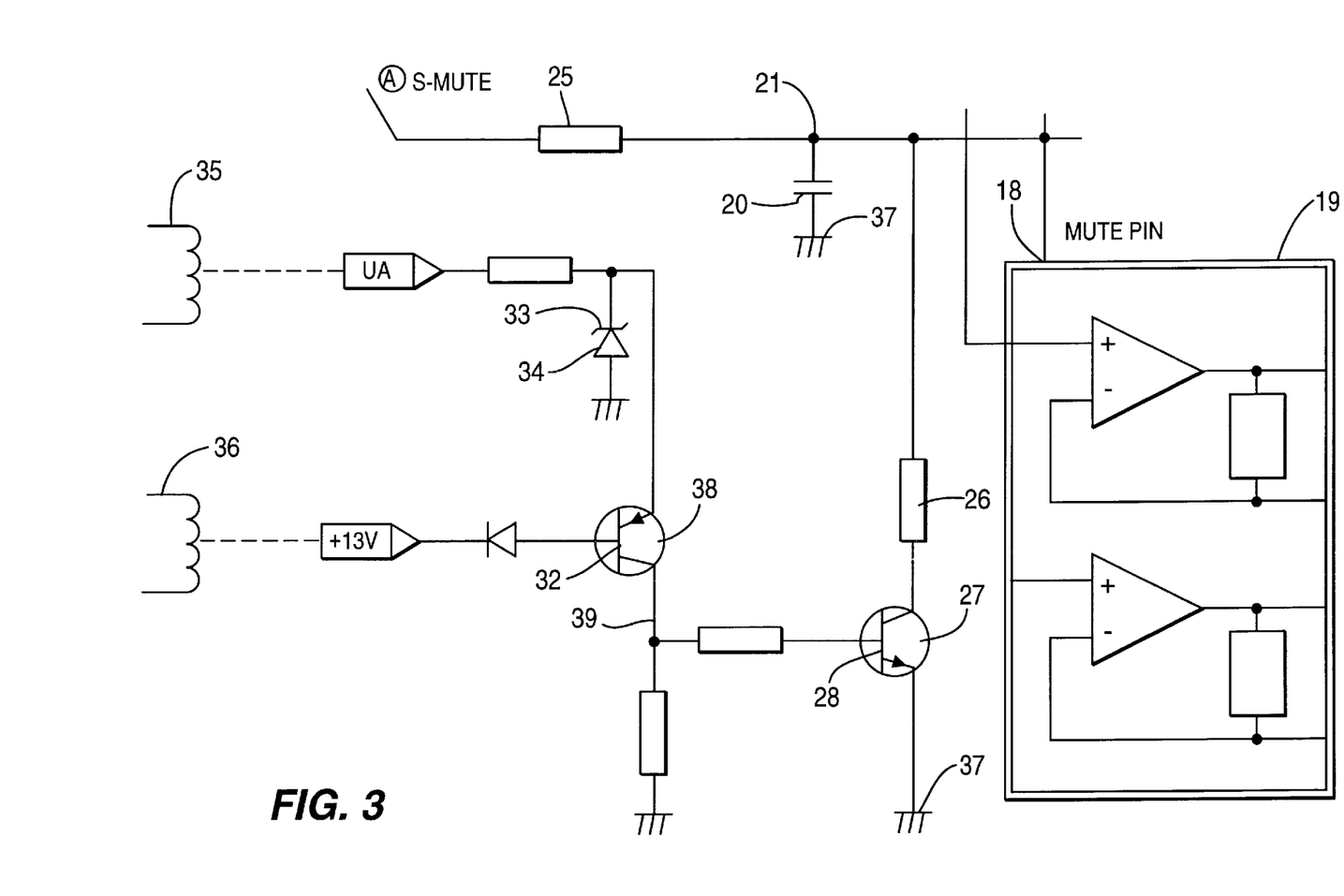
FIG. 3 is an electrical diagram showing an embodiment of the invention.

FIG. 3 represents an electrical diagram of a mute trigger circuit according to the invention. The purpose of said circuit is still to pull down the voltage at the mute pin 18 of an audio amplifier circuit 19. For this purpose a transistor 27 having a base 28 is, as in the prior art, used and fired on to empty or discharge capacitor 20 when there is a power interruption. In the embodiment shown in FIG. 3 transistor 27 is an NPN transistor the collector of which is connected to end 21 of capacitor 20 through a resistor 26. The emitter of transistor 27 is connected to a constant voltage 37 which in this case is provided by earth. Base 28 of transistor 27 is coupled to a first electrode 39 of a trigger transistor 38. A second electrode 31 of said transistor 38 is connected to a constant voltage source produced out of the switched mode power supply represented as a winding 35 in FIG. 3. The base 32 of said transistor 38 is coupled to voltage source produced out of the fly-back transformer represented as a winding 36 in FIG. 3. The links with voltage source 35 and 36 have been represented in FIG. 3 by a doted line only, because the intermediate circuit portions are well known and of no interest for the sake of the present invention.

In normal operation the voltage of the second electrode of transistor 38 is clamped to a voltage which is about equal to the voltage of the base 32 of transistor 38, so that transistor 38 is blocked. In the example shown on FIG. 3 transistor 38 is a PNP transistor and it is the emitter 31 of said transistor which is coupled to the switched mode power supply. As long as the emitter base voltage is less than about 1,4 volts which is the threshold value to fire on transistor 38, said transistor 38 is blocked. Also in the example of FIG. 3, the voltage source to which base 32 of transistor 38 is coupled is a 13 volts source generated from the fly-back transformer. In order to clamp the voltage of the emitter 31 as base 32, emitter 31 of transistor 38 is coupled to a terminal 33 of a zener diode 34. When a power interruption is generated, voltage coming from the fly-back transformer decreases faster than voltage coming from the switched mode transformer so that the difference of voltage between emitter 31 and base 32 of transistor 38 increases and transistor 38 is fired on. Potential at the collector 39 of transistor 38 is driven toward a positive value and then so is the potential at the base 28 of transistor 27. Transistor 27 is fired on and mute terminal 18 is then dropped down.

Figure 4:
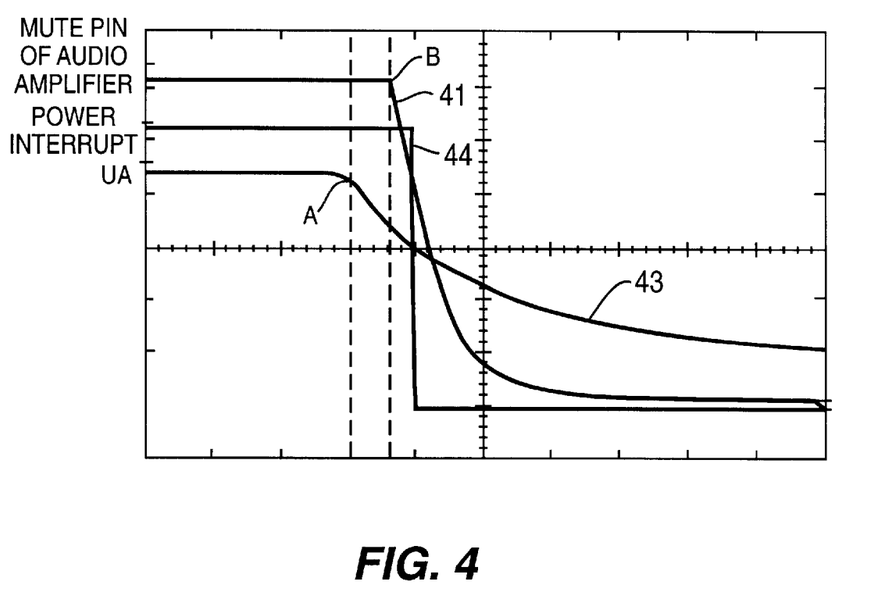
FIGS. 4, 5, and 6 are curves showing how fast, muting is reached with and without the invention.
Figure 5:
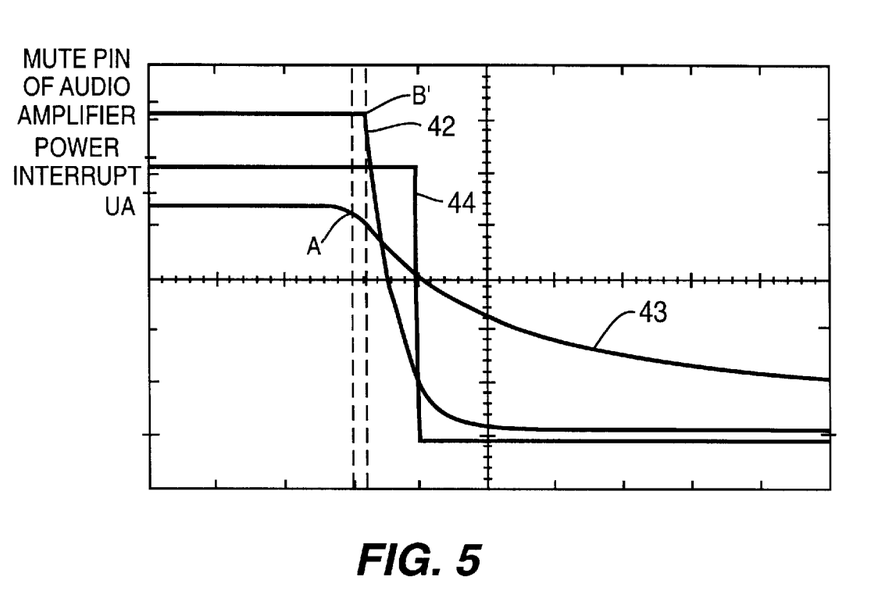
Figure 6:
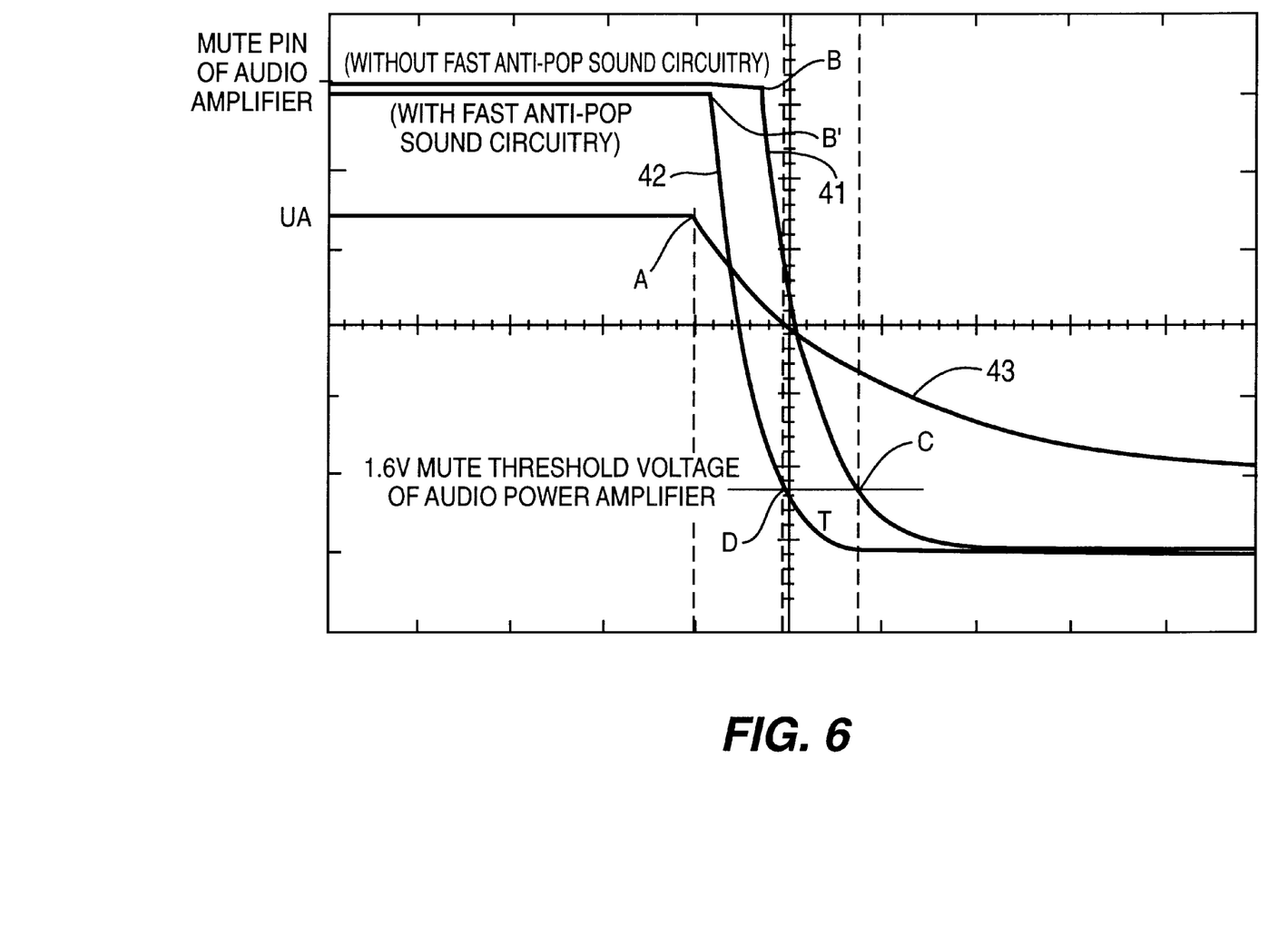

The improvement over known prior art is a faster reaction to mute the audio amplifier when the set is switched off. The improvement has been measured and will be thereafter discussed in relation with FIGS. 4, 5 and 6 on the one hand and FIG. 7 and 8 on the other hand. FIGS. 4, 5 and 6 are curves representing in ordinate the value of different voltages against time in abscissa. A first set of curves 41 and 42 represent the value of voltage at the mute pin 18 of the audio amplifier, without the invention for curve 41 and with the invention for curve 42. A second curve 43 represents the decreasing of UA which is a voltage from the switched mode power supply. A third curve 44 represents the voltage at the power interrupt input of microprocessor 1. On curve 43 one can see that the value of UA is constant up to a point A where the value of UA begins to decrease. The instant corresponding to point A is the instant when the TV set has been switched off. This instant is marked by a vertical dotted line on FIGS. 4 and 5. It is from this instant A that comparison in duration can be made.

Figure 7:
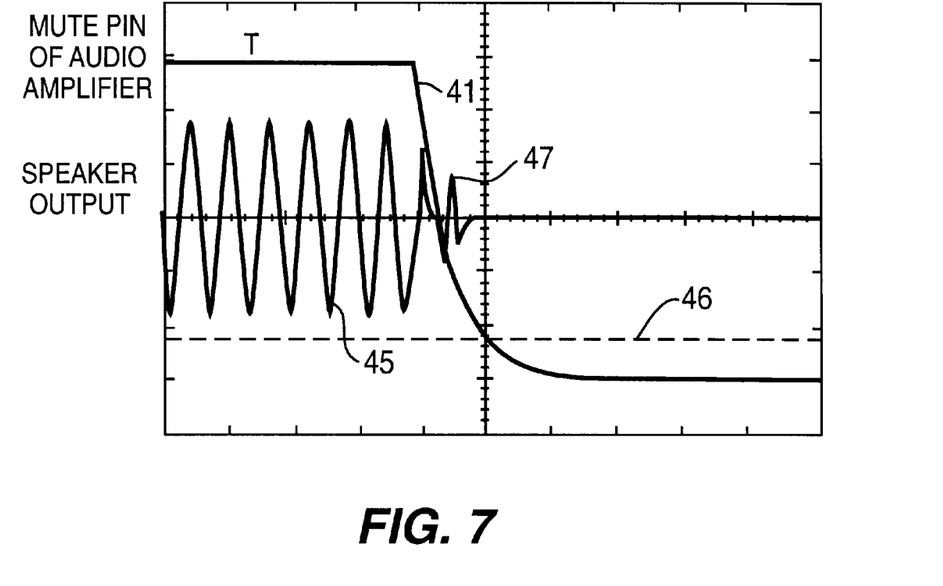
FIGS. 7 and 8 are curves representing the level of the output of an audio amplifier before and after an instant when power supply has been turn to off.
Figure 8:
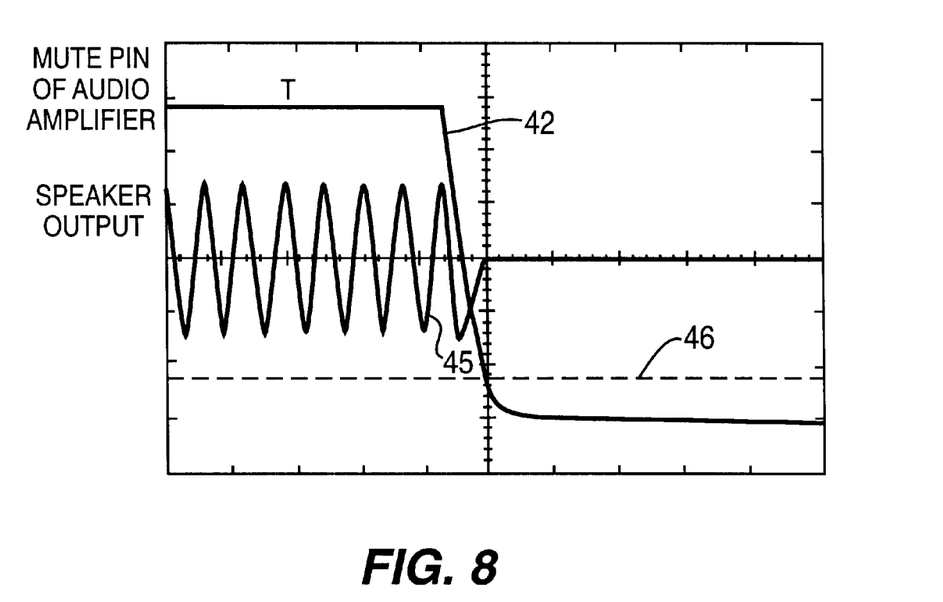

In FIG. 4 it may be seen that the voltage at mute pin 18 is first constant and begins to decrease a while after instant A. The instant at which voltage at pin 18 begins to decrease has been marked B on curve 41 FIGS. 4 and 6, and has been marked B' on curve 42 in FIGS. 5 and 6. The time elapsed between instant A and instant B that is without the invention is 60 milliseconds while the time elapsed between A and B' that is with the invention is 20 milliseconds. The difference of 40 milliseconds between A B and AB' does not in fact reflect the actual difference of timing with and without the invention. The audio amplifier is a class AB amplifier and the mute threshold is about 1.6 volts. Thus, the actual difference of timing should be observed for ordinate 1.6 volts. Comparison at the level of 1.6 volts is done on FIG. 6 where curves 41 and 42 have been both represented and where a horizontal line has been drawn at 1.6 level. Said horizontal line meets curves 41 and 42 at C and D respectively. The length of CD which is representative of the actual difference in muting is of 80 millisecond. The effect of this difference in timing on the output of the audio amplifier has been measured and is shown in FIGS. 7 and 8. In said Figures curve 45 represents the level of sound in normal operation for a first period and what happens when muting is applied. Curves 41 and 42 are represented respectively in FIG. 7 and 8. The voltage of muting is represented in the two FIGS. 7 and 8 by a horizontal dotted line 46. When voltage at pin 18 reaches the level of muting, the output of the audio amplifier is null or zero. In FIG. 7 it may be seen that between the instant where voltage at mute pin 18 begins to decrease and the instant where mute level is reached, a spike 47 is present at the output of the audio amplifier. It is supposed that said spike 47 is at the origin of pop sound being heard. In FIG. 8 said spike 47 is no longer present du to the rapidity of the reaction on the voltage of the mute pin.

I claim:

1. An electronic appliance including a power supply fitted with a switched mode transformer and a fly-back transformer said appliance including an audio amplifier, said audio amplifier having a mute pin, the voltage of which is dependent upon the charge of a capacitor having one end coupled to said mute pin, said capacitor being also connected to a constant voltage terminal through a first transistor having, a collector an emitter and a control electrode and said capacitor being connected to said constant voltage terminal through the collector emitter path of said first transistor, wherein the base of said first transistor is connected to a first electrode of a second transistor which also has a second electrode and a base electrode, a first electrode-second electrode path of said second transistor being coupled to a voltage source of the switched mode power transformer and wherein the base of said second transistor is coupled to a voltage source produced out of the fly-back transformer so that when switching the electronic appliance from on to off or stand-by, the second transistor becomes conductive and triggers the first transistor that becomes also conductive causing the collector emitter path of said first transistor to discharge said capacitor and to mute the audio amplifier.

2. An electronic appliance according to claim 1 wherein said first transistor is an NPN transistor and wherein said second transistor is a PNP transistor.

3. An electronic appliance according to claim 2 wherein said first electrode of said second transistor is the collector of the transistor and wherein said second electrode of said second transistor is the emitter of said second transistor.

4. An electronic appliance according to claim 1 wherein one of the electrodes of the second transistor is connected to one end of a zener diode, said zener diode clamping a voltage applied to said one electrode at a level the difference of which from a voltage applied to the base of said second transistor is less than a threshold level that would cause said second transistor to become conductive.

5. An electronic appliance including a power supply fitted with a first transformer and a second transformer, the value of voltages provided by said first transformer decreasing with time when the appliance is turned off, at a lower speed than the voltage supplied out of said second transformer, said appliance including also an audio amplifier, said amplifier having a mute pin the voltage of which is dependent upon the charge of a capacitor having one end coupled to said mute pin, said capacitor being also connected to a constant voltage terminal through a discharging circuit including an active element, said active element having at least a first electrode and a second electrode, said first electrode being coupled to a first voltage source coming from the first transformer, said second electrode being coupled to a second voltage source coming from the second transformer, said active element becoming conductive when the difference between voltages produced by the first and second sources is sufficient to trigger said active element.

6. An electronic appliance including a power supply fitted with a first and a second transformer, the value of voltages provided by said first transformer decreasing with time when the appliance is turned off, at a lower speed than the voltage supplied out of said second transformer, said appliance including also an audio amplifier, said amplifier having a mute pin, the voltage of which is dependent upon the charge of a capacitor having one end coupled to said mute pin, said capacitor being also connected to a constant voltage terminal through a first transistor having a collector an emitter and a control electrode and said capacitor being connected to said constant voltage terminal through the collector emitter path of said first transistor, wherein the base of said first transistor is connected to a first electrode of a second transistor, which also has, a second electrode and a base, a first electrode-second electrode path of said second transistor being coupled to a voltage source of the first transformer, and wherein the base of said second transistor is coupled to a voltage source of the second transformer, so that when switching off the electronic appliance, the second transistor becomes conductive and trigger the first transistor that becomes also conductive causing the collector emitter path of said first transistor to discharge said capacitor and to mute the audio amplifier.

7. An electronic appliance comprising:

a first power source coming from a winding of a transformer of a switched mode power supply;

a second power source coming from a winding of a fly-back transformer;

said first power source and said second power source being responsive to a power interruption so that the voltages produced by the winding of the switched mode supply and the winding of the fly-back transformer change at different rates;

a muting circuit;

means for determining a difference between a first voltage derived from the first power source and a second voltage derived from the second power source when the appliance is switched off, and means for actuating said muting circuit when said difference reaches a threshold value.

* * * * *